United States Patent [19]

Sedita

[11] Patent Number: 5,417,842
[45] Date of Patent: May 23, 1995

[54] END LOCK MAGAZINE FOR SEMICONDUCTOR DEVICES

[75] Inventor: Jay R. Sedita, Plano, Tex.

[73] Assignee: Texas Instruments Incorporated, Dallas, Tex.

[21] Appl. No.: 113,622

[22] Filed: Aug. 30, 1993

[51] Int. Cl.⁶ ............................................. B65D 73/02
[52] U.S. Cl. .................................. 206/328; 206/334; 206/332; 206/526
[58] Field of Search ................. 206/1.5, 328, 332, 334, 206/526, 340; 361/212, 220; 229/149, 150

[56] References Cited

U.S. PATENT DOCUMENTS

| | | | |
|---|---|---|---|
| 1,681,700 | 8/1928 | Folmer | 229/149 |
| 1,827,315 | 10/1931 | Hallen | 206/340 |
| 3,703,256 | 11/1972 | Ross | 229/149 |
| 3,765,594 | 10/1973 | Cramphorn | 229/149 |
| 4,037,267 | 7/1977 | Kisor | 361/220 |
| 4,533,043 | 8/1985 | Swain | 206/328 |
| 4,553,190 | 11/1985 | Mueller | 361/212 |
| 4,635,794 | 1/1987 | Lemmer | 206/334 |
| 4,685,562 | 8/1987 | Swain | 206/328 |
| 4,979,615 | 12/1990 | Duncan | 206/328 |

FOREIGN PATENT DOCUMENTS

| | | | |
|---|---|---|---|
| 2121764 | 1/1984 | United Kingdom | 206/328 |

*Primary Examiner*—David T. Fidei
*Attorney, Agent, or Firm*—W. James Brady, III; Richard L. Donaldson

[57] ABSTRACT

Disclosed is a magazine for holding semiconductor devices during storage and shipping wherein a portion 22 of the magazine is cut to form a tab 28 which is pushed through an opening 29 in a wall 23 of said magazine to block the end of the magazine, preventing semiconductor devices from falling out of said magazine.

2 Claims, 8 Drawing Sheets

PRIOR ART

END LOCK MAGAZINE FOR SEMICONDUCTOR DEVICES

BACKGROUND OF THE INVENTION

This invention relates to semiconductor devices, and more particularly to a magazine for holding semiconductor devices during storing and shipping.

BACKGROUND OF THE INVENTION

Semiconductor devices, including integrated circuits have been stored and plastic tubes to protect the devices, and particularly the leads to prevent damage such as bending and breaking. The tubes have been simple tubes in which the devices are inserted, and then a plug inserted into the end of the tube. More recent storage tubes have a platform extending through the center of the tube on which the body of the device is supported with the conductor leads on each side of the device separated by the platform. Each end of the tube has a resilient plug that is inserted into the tube to prevent the devices form following out. In another embodiment, a pin is inserted in an opening in the end of the tube. The pin extends through the tube and prevents the devices from falling out of the tube. A disadvantage of the pin and plug is that they may be lost, and it is an additional part that has to be made for use with the magazine.

SUMMARY OF THE INVENTION

The invention is a magazine for storing or shipping semiconductor devices, including integrated circuits, in which the locking or securing part is an integral part of the magazine. The locking part is a tab that is die cut into the plastic magazine, and then is bent or folded into a position that closes the end of the magazine preventing devices stored therein from falling from the magazine. The blocking or locking tab may be a part of an outer wall of the magazine, or may be part of the platform within the magazine on which the semiconductor devices are supported. In both designs, the tab is bend up or down, as the case may be, and the end of the tab is secured in an opening in a wall of the magazine.

The technical advance represented by the invention, as well as the objects thereof, will become apparent from the following description of a preferred embodiment of the invention when considered in conjunction with tile accompanying drawings, and the novel features set forth in the appended claims.

DESCRIPTION OF A PREFERRED EMBODIMENT

Figure 1:
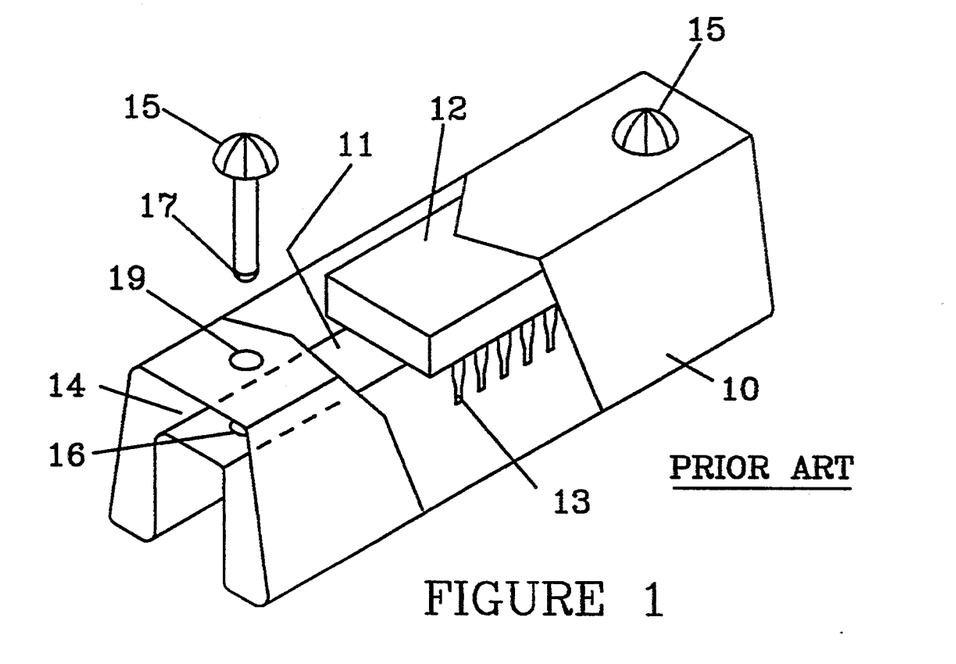
FIG. 1 is a semiconductor magazine of the prior art.

FIG. 1 is a prior art magazine that utilizes a pin-lock to hold semiconductor devices in the magazine. Magazine 10 has a platform 11 on which devices 12 are placed through opening 14 in the end of the magazine, with the device pins 13 on each side of platform 11. Pins 15 and 18 in each end of the magazine prevent the semiconductor devices from sliding out of the magazine. Pin 15 is inserted in holes 16 and 19 and is secured in the holes by enlarged pin end 17, which is slightly larger than the hole. Because the plastic from which the magazine is made is resilient, the enlarged end 17 may be forced through the hole, and then pulled out when the devices are to be removed from the magazine.

Figure 2:
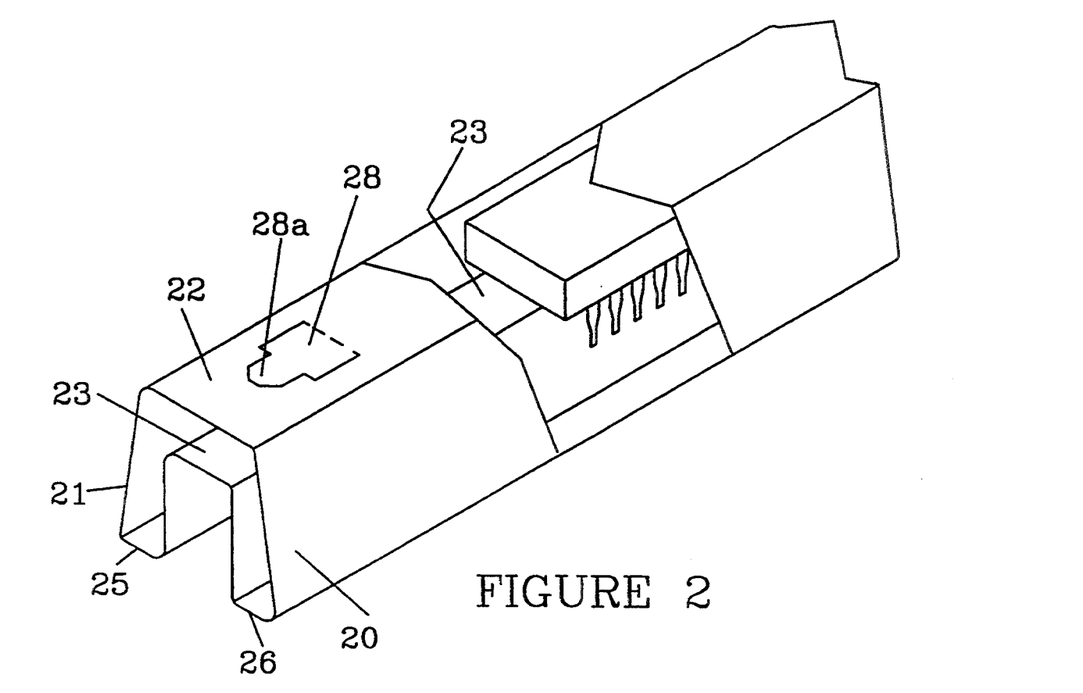
FIG. 2 is an isometric drawing of an embodiment of the present invention.
Figure 2A:
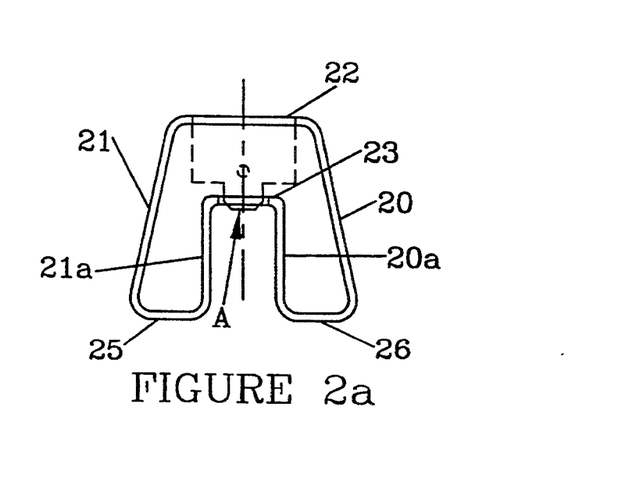
FIGS. 2a, 2b and 2c are end, top and side views of a magazine of Figure.
Figure 2B:
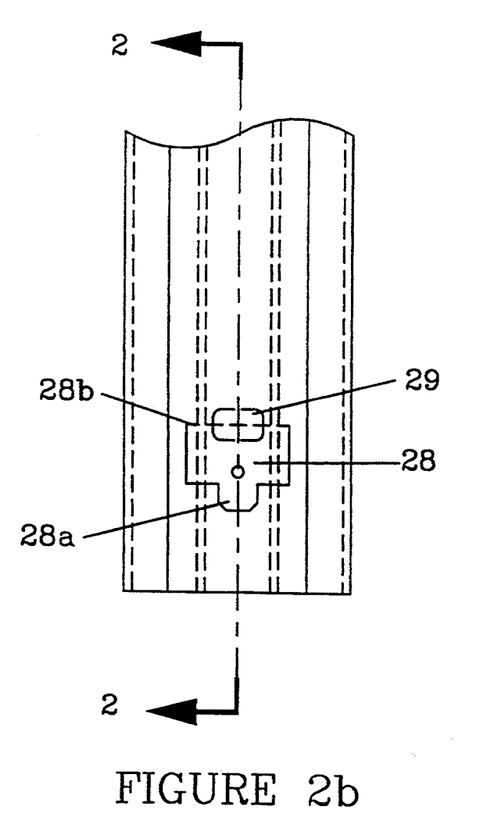
Figure 2C:
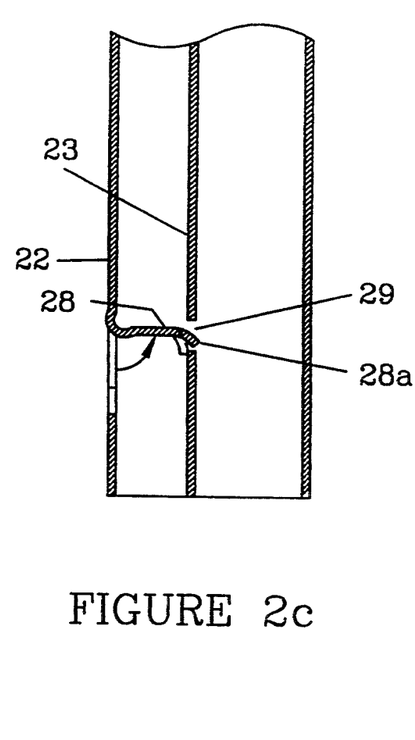

FIGS. 2, 2a, 2b and 2c illustrate an embodiment of the invention. FIG. 2 shows a magazine with a semiconductor device on platform 23 and locking tab 28 in wall 22. FIG. 2a is an end view of the magazine, FIG. 2b is a top view of the magazine, and FIG. 2c is a cross-sectional view taken along section line 2—2 of FIG. 2b. Illustrated is a magazine for storing or shipping semiconductor devices. The magazine includes a hollow tube having a generally C-shaped body. The back of the "C", which as viewed in FIG. 2a, is at the top of the tube and is labeled 22. The two arms of the "C" are 25 and 26 are hollow, having outside walls and inside walls. Arm 26 has an outside wall 20 and an inside wall 20a, and arm 25 has an outside wall 21 and an inside wall 21a. Between and joining inside walls 20a and 21a is platform 23. A locking tab 28 is die cut in wall 22. The tab is cut around all sides except side 28b which is only partially cut to provide a hinge to allow tab to be bent downward to block the end of the magazine, and prevent semiconductor devices in the tube from siding out. End 28a of tab 28 is pushed downward and inserted into opening 29 in platform 23, as illustrated in FIG. 2c. This locking feature prevents the pressure of semiconductor devices pressing against tab 28 from lifting tab 28 up, allowing the devices to side out of the magazine. To open the end of the magazine, tab 28 is lifted upward by pushing up on tab end 28a from the bottom of platform 23, as indicated by arrow "A".

Figure 3A:
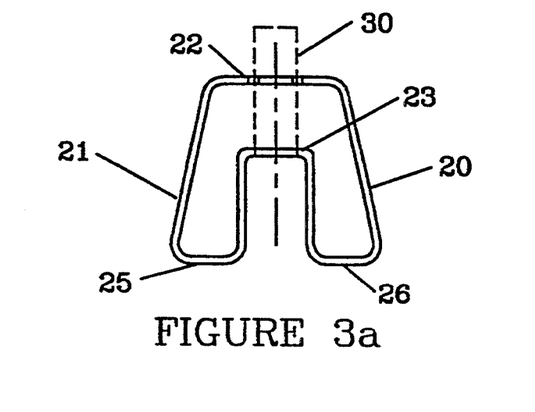
FIGS. 3a, 3b and 3c are end, top and side views of another embodiment of the present invention.
Figure 3B:
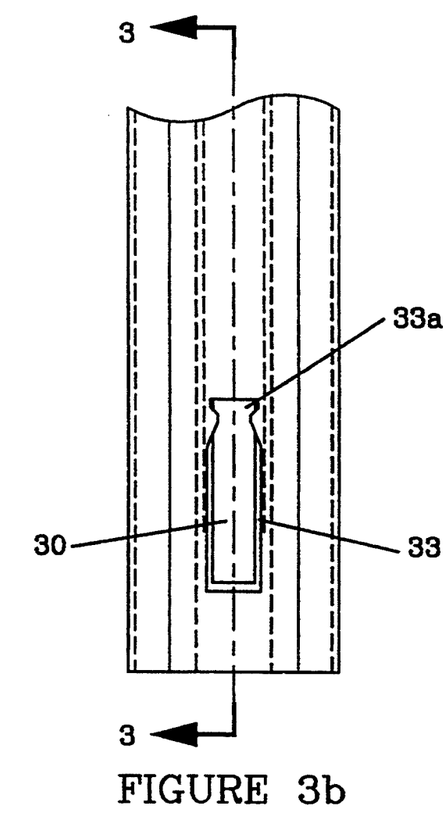
Figure 3C:
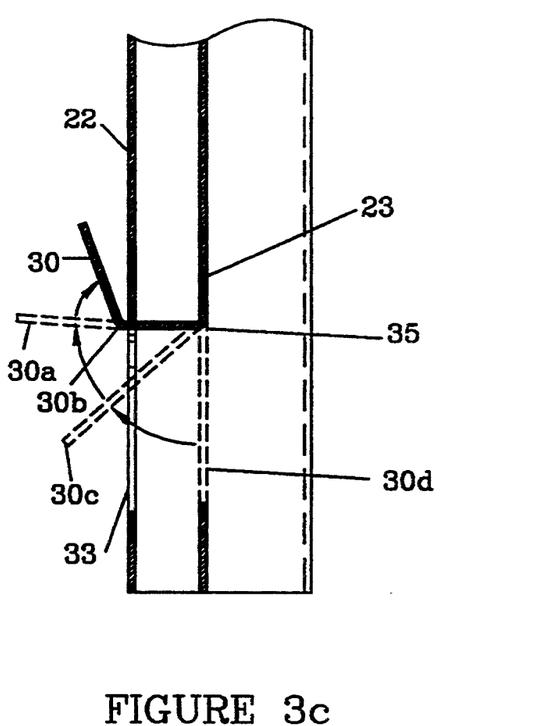

FIG. 3a, 3b and 3c illustrated a variation in the locking tab. Tab 30 is die cut in platform 23, leaving a hinge at 35. An opening 33 is cut in wall 22, directly above tab 30. To lock the end of the magazine, tab 30 is pushed upward from the under side of platform 23, pushing tab 30 up through opening 33, blocking the end of the magazine. Opening 33 has a reduction section 33a at one end, so that tab 30 may be bent at 30b by applying pressure on tab end 30, forcing tab 30 into the reduced section 33a, locking tab 30 in place. To open the end of the magazine, tab 30 is pulled out of reduced section 33a, and pressed downward through opening 33 to clear the end of platform 23, opening the end of the magazine. Tab 30 is shown in several positions in FIG. 3c, and indicated as 30, 30a, 30b, and 30c.

Figure 4A:
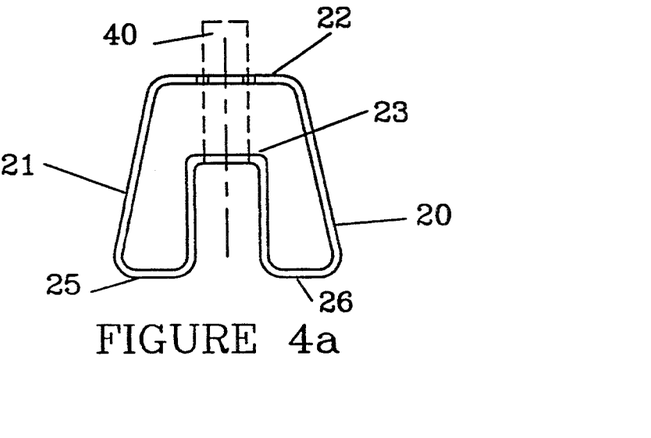
FIGS. 4a, 4b and 4c are end, top and side views of another embodiment of the present invention.
Figure 4B:
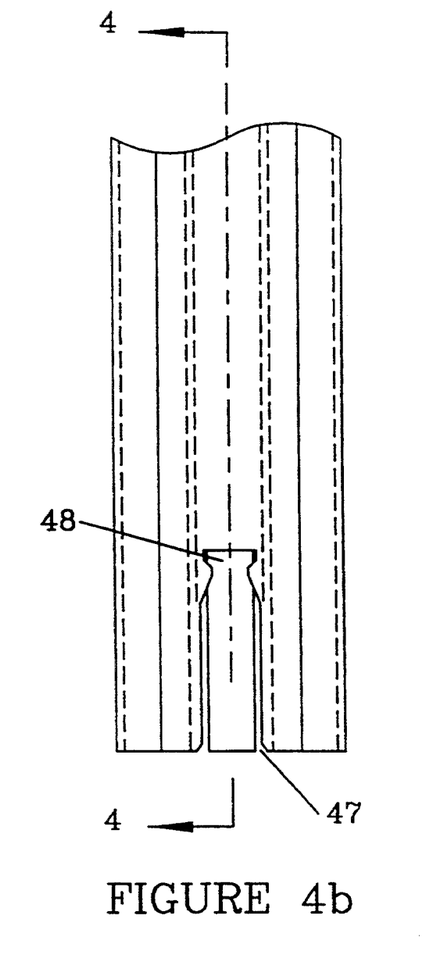
Figure 4C:
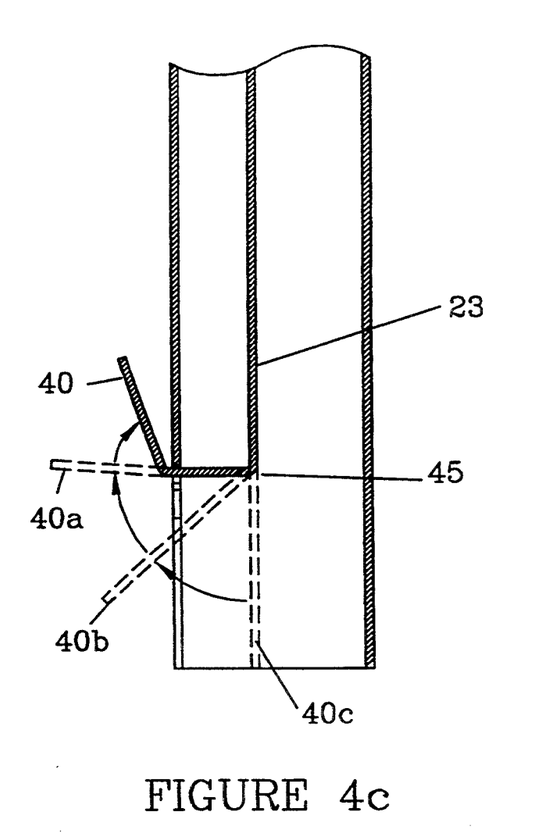

FIGS. 4a, 4b and 4c illustrate a variation on the locking tab of FIGS. 3a, 3b and 3c. In this embodiment, tab 40 is cut from the end of platform 23, not spaced from the end as in FIGS. 3a, 3b and 3c. By cutting tab 40 at the end of the magazine, access to the tab is easier, and it is lifted upward through opening 47 in wall 22, and pushed into reduced section 48 to hold it locked in place. Tab 40 is shown in various positions as illustrated at 40a, 40b and 40c.

Figure 5A:
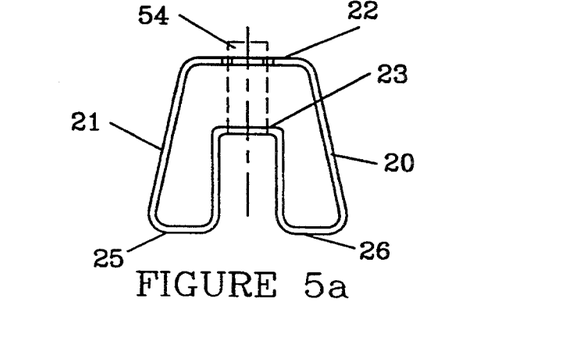
FIGS. 5a, 5b and 5c are end, top and side view of another embodiment of the present invention.
Figure 5B:
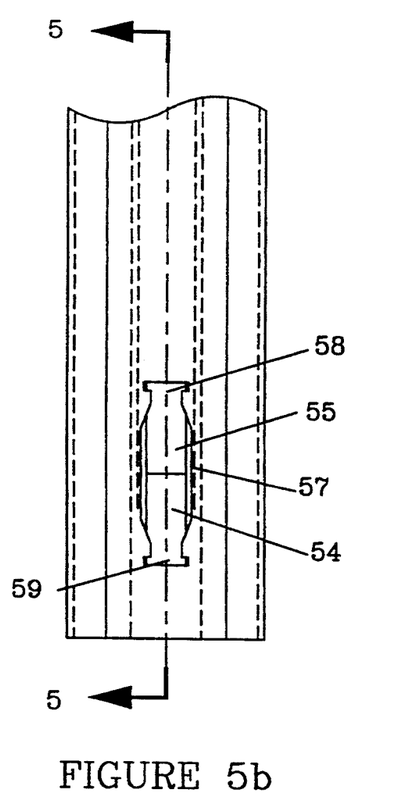
Figure 5C:
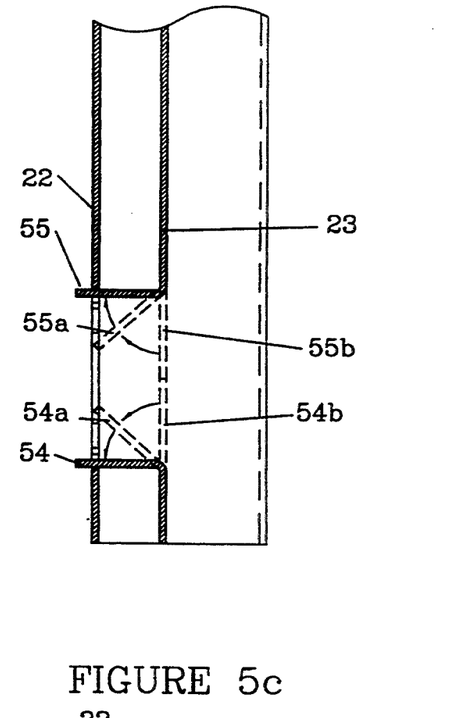
Figure 6A:
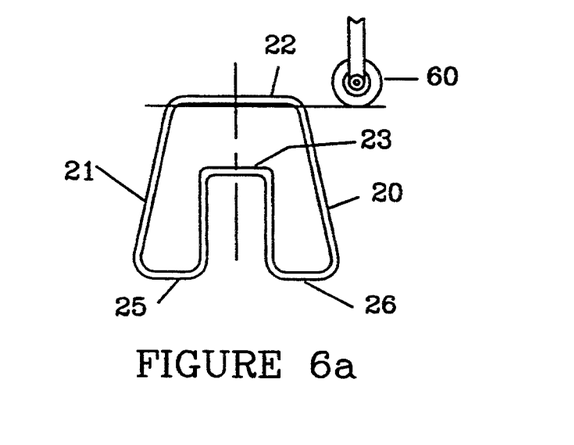
FIGS. 6a, 6b and 6c are end, top and side view of another embodiment of the present invention.
Figure 6B:
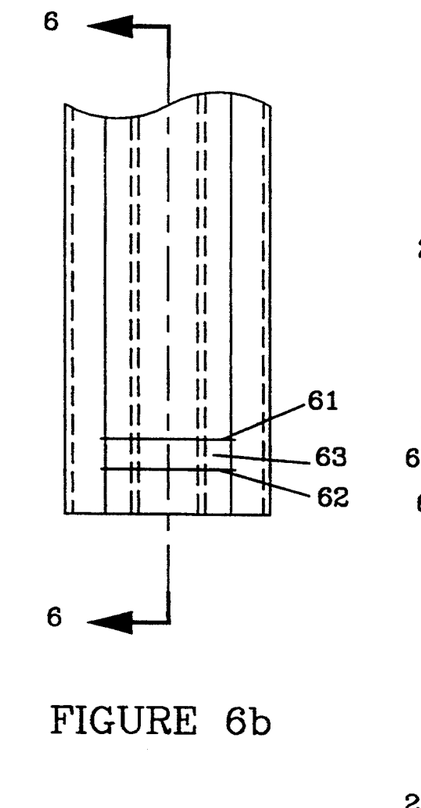
Figure 6C:
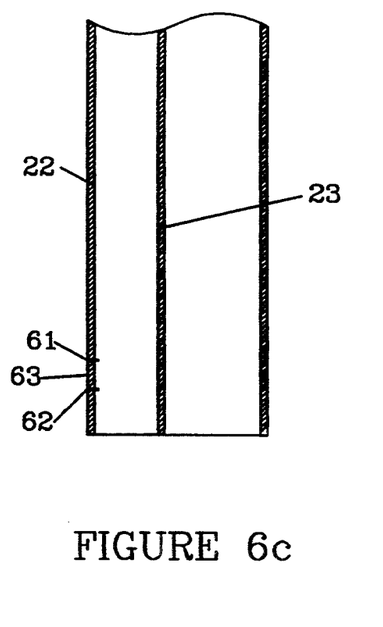

FIGS. 5a, 5b and 5c illustrate an embodiment for a locking tab that includes two tabs 54 and 55. Tabs 54 and 55 are cut from platform 23 on three sides, leaving a fourth side to serve as a hinge for the tab. An opening 57 is cut in wall 22 directly above tabs 54 and 55. Opening 57 has reduced sections 58 and 59 on each end of the opening. To lock the magazine, tabs 54 and 55 are bent upward through opening 57 and each tab is forced into a reduced section of opening 57 to hold the tab in a locked position. To open the end of the magazine, tabs 54 and 55 pushed out of the locked positions and pressed downward to clear the end of the magazine, permitting devices to be removed. Tab 54 is shown in positions 54a and 54b, and tab 55 is show in positions 55a and 55b.

Figure 7A:
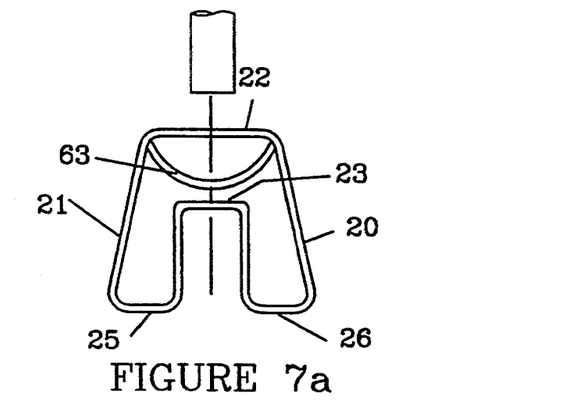
FIGS. 7a, 7b and 7c show the embodiment of FIGS. 6a, 6b and 6c with the tab in the lock position.
Figure 7B:
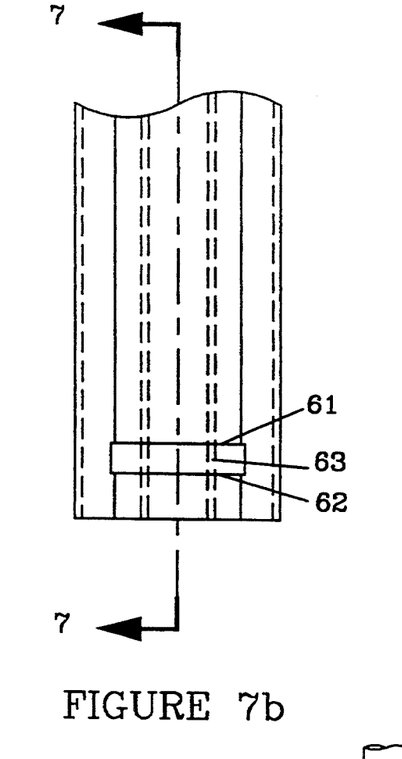
Figure 7C:
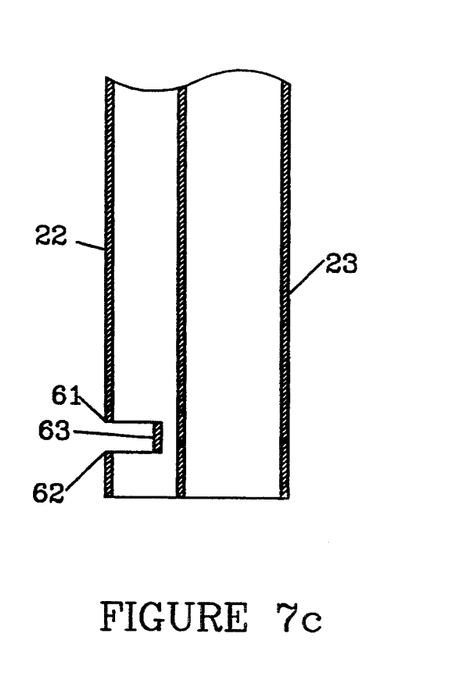

FIGS. 6a, 6b, 6c, 7a, 7b and 7c illustrate another embodiment of the invention. In this embodiment, the top side 22 has two parallel cuts made in the top. The cut may be made, for example, with a roller cutter 60 that has two parallel cutting wheels. The cut may also be die cut. The cut is made across the top 22 and may extend slightly down each side 20 and 21. The cuts in the sides 20 and 21 are to ensure that top 22 is cut complete through. After the cut is made, and semiconductors (not illustrated) have been loaded into the magazine, the cut area 63 is pushed downward with a small rod 64, to bend and stretch the cut area downward as shown in FIG. 7a. Since the material of the magazine is a plastic material, the material will slightly stretch and will bow downward under pressure. To open the end of the magazine, a tool such as a screw driver, or rod 64, is inserted under tab 63 and it will bend upward, opening the end of the magazine.

Each of the above embodiments is made from a plastic material that is resilient that permits the tabs to be bent into and out of a locking position without breaking the tabs at the hinged end. The magazines may be made of any length, with a locking tab on each end. The magazines required no separate parts for securing the ends of the magazines, and since the tabs are an integral part of the magazine, the tabs cannot be lost or misplaced. Variation on the size, placement and shape of the tabs may be made without departing from the scope of the invention as defined in the appended claims.

What is claimed:

1. A magazine for storing and transporting semiconductor devices, comprising:

a magazine body of a resilient material, including a channel enclosed by walls, one of said walls defining a platform on which semiconductor devices are placed, and an opening in at least one end of the magazine body;

a first tab formed in one wall of the magazine body, adjacent to said at lest one end of the magazine body;

a second tab formed in said one wall of the magazine body, adjacent to said first tab;

an opening in another wall of said magazine through which said first and second tabs are bent to block the channel to prevent semiconductor devices therein from falling out said at least one end of said magazine body, said opening having first and second reduced sections adjacent opposite ends of the opening, said first reduced section for holding said first tab in a locked position, said second reduced section for holding said second tab in a locked position.

2. The magazine according to claim 1, wherein said first and second tabs are formed from said wall defining a platform.

* * * * *